United States Patent
Pan et al.

(10) Patent No.: US 9,340,875 B2
(45) Date of Patent: May 17, 2016

(54) REACTION DEVICE WITH PERIPHERAL-IN AND CENTER-OUT DESIGN FOR CHEMICAL VAPOR DEPOSITION

(71) Applicant: INDUSTRIAL TECHNOLOGY RESEARCH INSTITUTE, Hsinchu (TW)

(72) Inventors: Yi-Tsung Pan, Tainan (TW); Mu-Jen Young, Hsinchu County (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 14/096,390

(22) Filed: Dec. 4, 2013

(65) Prior Publication Data
US 2014/0370689 A1  Dec. 18, 2014

(30) Foreign Application Priority Data
Jun. 17, 2013  (TW) .............................. 102121329 A

(51) Int. Cl.
*C23C 16/00* (2006.01)
*C23C 16/44* (2006.01)
*H01L 21/02* (2006.01)
(Continued)

(52) U.S. Cl.
CPC ......... *C23C 16/4412* (2013.01); *C23C 16/4584* (2013.01); *C23C 16/45508* (2013.01); *H01L 21/0254* (2013.01); *H01L 21/0262* (2013.01); *H01L 21/02538* (2013.01); *H01L 21/02551* (2013.01); *H01L 21/02576* (2013.01); *H01L 21/02579* (2013.01)

(58) Field of Classification Search
CPC ................................ C23C 16/44; H01L 21/02
USPC ........................ 438/478; 118/715, 725, 730
See application file for complete search history.

(56) References Cited

U.S. PATENT DOCUMENTS

| 4,732,110 A | 3/1988 | Parsons |
| 5,106,453 A | 4/1992 | Benko et al. |
| 5,173,336 A | 12/1992 | Kennedy |

(Continued)

FOREIGN PATENT DOCUMENTS

| CN | 1403627 A | 3/2003 |
| CN | 1411516 A | 4/2003 |

(Continued)

OTHER PUBLICATIONS

Taiwanese Office Action dated Dec. 2, 2014.
Rinku P. Parikh et al., "Validating gallium nitride growth kinetics using a precursor delivery showerhead as a novel chemical reactor" Journal of Crystal Growth 296, pp. 15-26, Jul. 20, 2006.

(Continued)

*Primary Examiner* — Caleb Henry
(74) *Attorney, Agent, or Firm* — Rabin & Berdo, P.C.

(57) ABSTRACT

A reaction device for chemical vapor deposition is disclosed. The reaction device includes a chamber, a susceptor, an inlet pipe unit and an outlet pipe. The susceptor is disposed within the chamber. The inlet pipe unit includes a plurality of feeding openings horizontally facing the peripheral area of the susceptor to input at least one reaction gas into the chamber. The at least one reaction gas is guided to move from the peripheral area of the susceptor and along a surface of the susceptor to reach the center of the susceptor. The outlet pipe includes a discharge opening whose position is corresponding to the center of the susceptor so as to discharge the reaction gas flowing to the center of the susceptor out of the chamber.

13 Claims, 8 Drawing Sheets

(51) Int. Cl.
*C23C 16/455* (2006.01)
*C23C 16/458* (2006.01)

(56) References Cited

U.S. PATENT DOCUMENTS

| | | | |
|---|---|---|---|
| 5,574,247 A | | 11/1996 | Nishitani et al. |
| 5,630,881 A | * | 5/1997 | Ogure et al. ............... 118/730 |
| 6,013,319 A | * | 1/2000 | Dietze ..................... 427/255.28 |
| 6,045,617 A | | 4/2000 | Keller |
| 6,093,252 A | * | 7/2000 | Wengert et al. ............. 118/719 |
| 6,309,465 B1 | | 10/2001 | Jurgensen et al. |
| 6,473,563 B2 | | 10/2002 | Takamatsu et al. |
| 6,656,284 B1 | * | 12/2003 | Hwang et al. ............... 118/715 |
| 6,892,669 B2 | | 5/2005 | Xu et al. |
| 2005/0011459 A1 | | 1/2005 | Liu |
| 2005/0178336 A1 | | 8/2005 | Liu |
| 2006/0266289 A1 | * | 11/2006 | Verghese et al. ............ 118/715 |
| 2006/0288933 A1 | | 12/2006 | Lee et al. |
| 2007/0209589 A1 | | 9/2007 | Liu |
| 2008/0005197 A1 | | 1/2008 | Chang et al. |
| 2010/0068381 A1 | | 3/2010 | Liu |
| 2010/0199914 A1 | | 8/2010 | Iza |
| 2010/0316815 A1 | | 12/2010 | Takagi et al. |
| 2012/0111271 A1 | | 5/2012 | Begarney et al. |

FOREIGN PATENT DOCUMENTS

| | | |
|---|---|---|
| CN | 1421543 A | 6/2003 |
| CN | 103103502 A | 5/2013 |
| TW | 201006952 A | 2/2010 |
| TW | 201009106 A | 3/2010 |
| TW | 201026887 A | 7/2010 |
| TW | 201028495 A | 8/2010 |
| TW | 201037100 A | 10/2010 |
| TW | I349302 B | 9/2011 |
| WO | WO 98-23788 A1 | 6/1998 |
| WO | WO 03-048414 A1 | 6/2003 |

OTHER PUBLICATIONS

T.J. Mountziaris et al., "A reaction-transport model of GaAs growth by metalorganic chemical vapor deposition using trimethyl-gallium and tertiary-butyl-arsine" Journal of Crystal Growth 131, pp. 283-299, Mar. 22, 1993.

S.A. Safvi et al., "GaN Growth by Metalorganic Vapor Phase Epitaxy: A Comparison of Modeling and Experimental Measurements" J. Electrochem. Soc., vol. 144, No. 5, pp. 1789-1796, May 1997.

Debasis Sengupta "Does the Ring Compound [$(CH_3)_2GaNH_2]_3$ Form during MOVPE of Gallium Nitride? Investigations via Density Functional and Reaction Rate Theories" J. Phys. Chem. B, vol. 107, No. 1, pp. 291-297, Dec. 4, 2002.

Rinku P. Parikh et al., "An overview of gallium nitride growth chemistry and its effect on reactor design: Application to a planetary radial-flow CVD system" Journal of Crystal Growth 286, pp. 259-278, Sep. 20, 2005.

Ziba Mani et al., "Reactor Design Considerations for MOCVD Growth of Thin Films" IEEE Transactions on Semiconductor Manufacturing, vol. 10, No. 2, pp. 295-306, May 1997.

T. Bergunde et al., "Process optimisation of MOVPE growth by numerical modelling of transport phenomena including thermal radiation" Journal of Crystal Growth 180, pp. 660-669, 1997.

Theodoros G. Mihopoulos et al., "Simulation of flow and growth phenomena in a closed-spaced reactor" Journal of Crystal Growth 195, pp. 725-732, 1998.

B. Mitrovic et al., "On the flow stability in vertical rotating disc MOCVD reactors under a wide range of process parameters" Journal of Crystal Growth 287, pp. 656-663, Dec. 22, 2005.

L. Kadinski et al., "Modeling Analysis of GaN/InGaN Deposition in MOCVD Vertical Rotating Disk Reactors" 10th European Workshop on MOVPE, Jun. 8-11, 2003.

H. Jürgensen et al., "MOCVD Equipment for Recent Developments towards the Blue and Green Solid State Laser" MRS Internet Journal of Nitride Semiconductor Research, vol. 1, Article 26, 1996.

Chinese Office Action dated Jan. 21, 2016.

* cited by examiner

REACTION DEVICE WITH PERIPHERAL-IN AND CENTER-OUT DESIGN FOR CHEMICAL VAPOR DEPOSITION This application claims the benefit of Taiwan application Serial No. 102121329, filed Jun. 17, 2013, the disclosure of which is incorporated by reference herein in its entirety.

TECHNICAL FIELD

The disclosure relates in general to a reaction device, and more particularly to a reaction device and a manufacturing method for chemical vapor deposition.

BACKGROUND

Most semiconductor manufacture processes comprise diffusion, ion implantation, and deposition, etching and cleaning. Particularly, the deposition process uses a large amount of reaction gas such as TMGa, $NH_3$ and $H_2$. After having been reacted within the chamber, a part of the gas forms products on the substrate (such as a wafer) and another part remains unreacted and forms exhaust which must be discharged from the chamber.

Let the reactor used in the chemical vapor deposition be taken for example. The reaction gas is mainly provided via feeding openings disposed above the substrate. The feeding openings vertically face a surface of the substrate, such that the reaction gas flows outwards from the center of the susceptor which supports the substrate and forms products on the surface of the substrate and the unreacted gas flows to the discharge opening from outer sides of the susceptor to be discharged from the chamber. The discharge opening is disposed under the susceptor. The channel design of reactor with the reaction gas being fed via the top and discharged via the bottom has following disadvantages. Since the reaction gas flows towards the peripheral area from the center of the susceptor, concentration and mass flow rate of the reaction gas both decrease along flowing direction, causing products to have a higher deposition rate at the center of the susceptor than at the peripheral area of the susceptor.

SUMMARY

The disclosure is directed to a reaction device and a manufacturing method for chemical vapor deposition.

According to one embodiment, a reaction device for chemical vapor deposition is disclosed. The reaction device includes a chamber, a susceptor, an inlet pipe unit and an outlet pipe. The susceptor is disposed within the chamber. The inlet pipe unit comprises a plurality of feeding openings horizontally facing the peripheral area of the susceptor to input at least one reaction gas into the chamber. The at least one reaction gas is guided to move from the peripheral area of the susceptor and along a surface of the susceptor to reach the center of the susceptor. The outlet pipe includes a discharge opening whose position is corresponding to the center of the susceptor so as to discharge the reaction gas flowing to the center of the susceptor out of the chamber.

According to another embodiment, a reaction process for a metal organic vapor phase epitaxy is disclosed. The reaction process for metal organic vapor phase epitaxy is applied in a reactor for performing chemical vapor deposition. The reaction product is a semiconductor of group III/V compounds. The feeding method is vapor feeding. The feeding source comprises an organometallic compound and a hydride gas. The organometallic compound comprises one of TMGa (trimethylgallium), TMAl (trimethylaluminum), TMIn (trimethylindium), $Cp_2Mg$ (bis(cyclopentadienyl)magnesium) and DIPTe (diisopropyltelluride). The hydride gas comprises one of arsine ($AsH_3$), phosphine ($PH_3$), ammonia ($NH_3$) and disilane ($Si_2H_6$). The reactor comprises a feeding opening horizontally facing a peripheral area of the susceptor to input at least one reaction gas into the chamber. The at least one reaction gas is guided to move from the peripheral area of the susceptor and along a surface of the susceptor to reach the center of the susceptor. The reactor comprises an outlet pipe comprising a discharge opening whose position is corresponding to the center of the susceptor so as to discharge the reaction gas flowing to the center of the susceptor out of the chamber.

The above and other aspects of the disclosure will become better understood with regard to the following detailed description of the non-limiting embodiment(s). The following description is made with reference to the accompanying drawings.

Figure 1A:
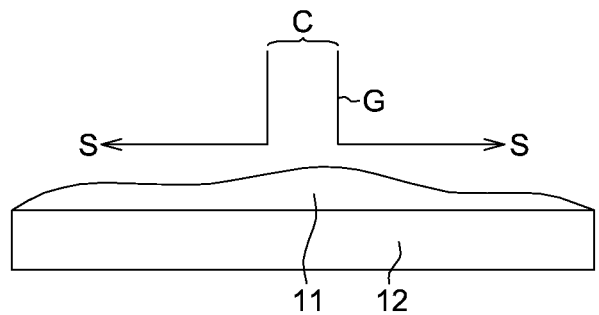
FIG. 1A is schematic diagram of a reaction gas moving towards a peripheral area from a center of a susceptor.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1B:
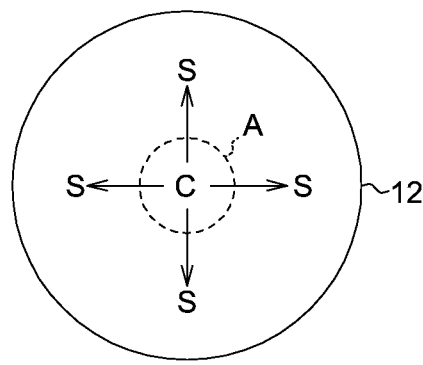
FIG. 1B is a schematic diagram of a diffusion area of a reaction gas continuously expanding along a moving direction.
Figure 1C:
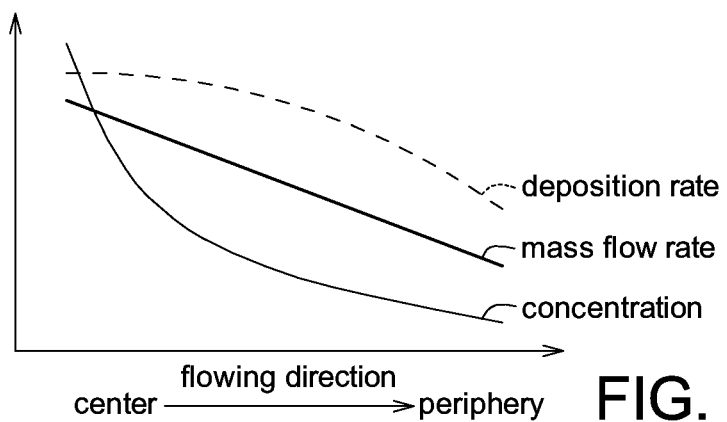
FIG. 1C is a schematic diagram illustrating a conventional design of central feeding cause concentration and mass flow rate of the reaction gas to decrease at the same time.

According to the reaction device applied in vapor deposition of the present embodiment, a reaction gas is guided to move towards center of the susceptor from peripheral area of the susceptor to resolve the problems of conventional channel design which causes products to have a higher deposition rate at center of the susceptor than at peripheral area of the susceptor. Referring to FIGS. 1A~1C. FIG. 1A is schematic diagram of a reaction gas G moving towards the peripheral area S from the center C of a susceptor 12. FIG. 1B is a schematic diagram of a diffusion area A of a reaction gas G continuously expanding along a moving direction. FIG. 1C is a schematic diagram illustrating a conventional design of central feeding cause concentration and mass flow rate of the reaction gas G to decrease at the same time. As indicated in FIG. 1A, the concentration of the reaction gas G is higher around the center C of the susceptor 120 but gradually decreases along with the deposition of a product 11. Consequently, the deposition rate is inconsistent and thickness of coating becomes non-uniform. As indicated in FIG. 1B, as the diffusion area A of the reaction gas G fed via the center increases, the mass flow rate of the reaction gas G decreases accordingly, causing the product 11 to have a higher deposition rate at the center C of the susceptor than at the peripheral area of the susceptor S. The above disclosure shows that the channel design with the reaction gas being fed via the center C and discharged via the periphery cannot improve the uniformity of vapor deposition.

Figure 2A:
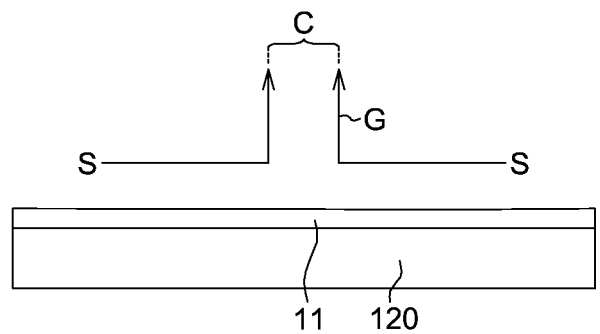
FIG. 2A is a schematic diagram of a reaction gas moving towards a center of a susceptor from a peripheral area.
Figure 2B:
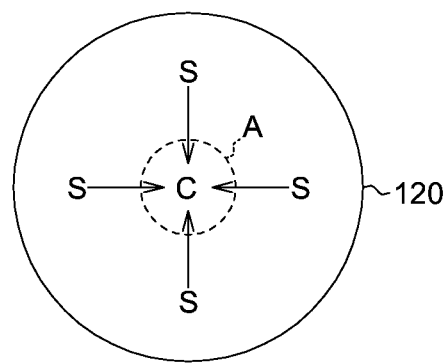
FIG. 2B is a schematic diagram of a diffusion area of a reaction gas continuously shrinking along a moving direction.
Figure 2C:
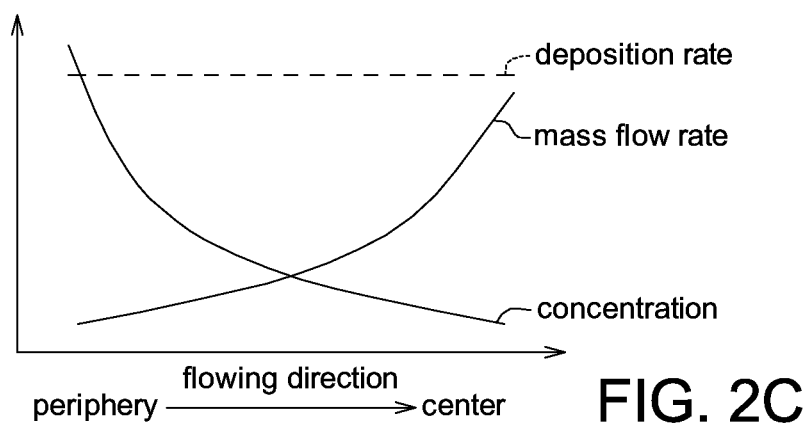
FIG. 2C is a schematic diagram illustrating mass flow rate of a reaction gas being increased by changing a feeding direction.

Referring to FIGS. 2A~2C. FIG. 2A is a schematic diagram of a reaction gas G moving towards the center C of a susceptor 12 from a peripheral area. FIG. 2B is a schematic diagram of a diffusion area of a reaction gas G continuously shrinking along a moving direction. FIG. 2C is a schematic diagram illustrating the mass flow rate of a reaction gas G being increased by changing a feeding direction. As indicated in FIG. 2A, the concentration of the reaction gas G is higher around the peripheral area S of the susceptor 120 but gradually decreases along with the deposition of the product 11. As indicated in FIG. 2B, as the reaction gas G is moved towards the center C, the diffusion area A shrinks and the mass flow rate of the reaction gas G is increased to compensate the decrease in the concentration of the reaction gas G, hence avoiding the thickness of coating being non-uniform due to inconsistent deposition rate. It can be known from the above disclosure that the channel design with the reaction gas being fed via the peripheral and discharged via the center can improve the uniformity of vapor deposition.

A number of embodiments are disclosed below for elaborating the invention. However, the embodiments of the invention are for detailed descriptions only, not for limiting the scope of protection of the invention.

Figure 3:
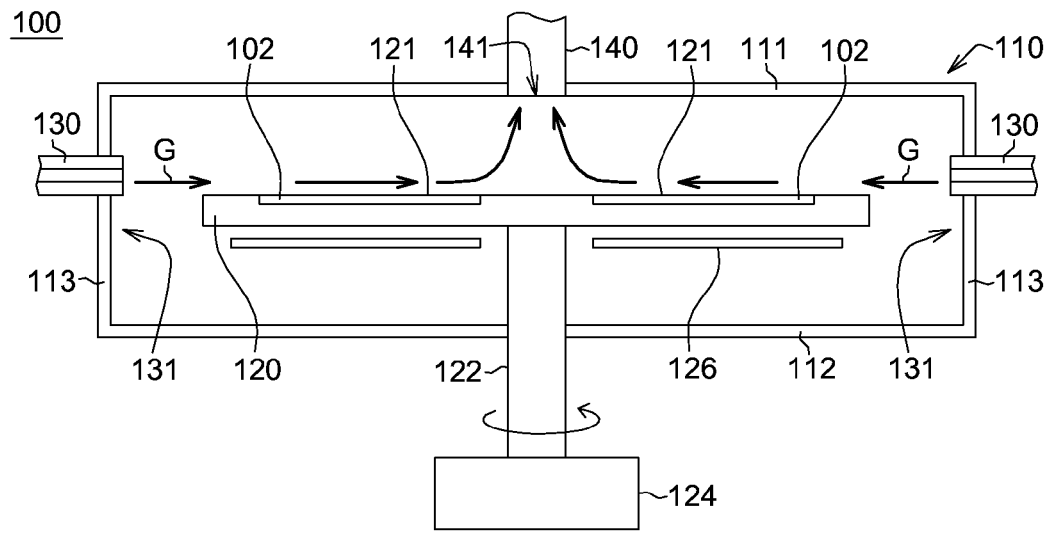
FIG. 3 is a schematic diagram of a reaction device applied in vapor deposition according to an embodiment.
Figure 4:
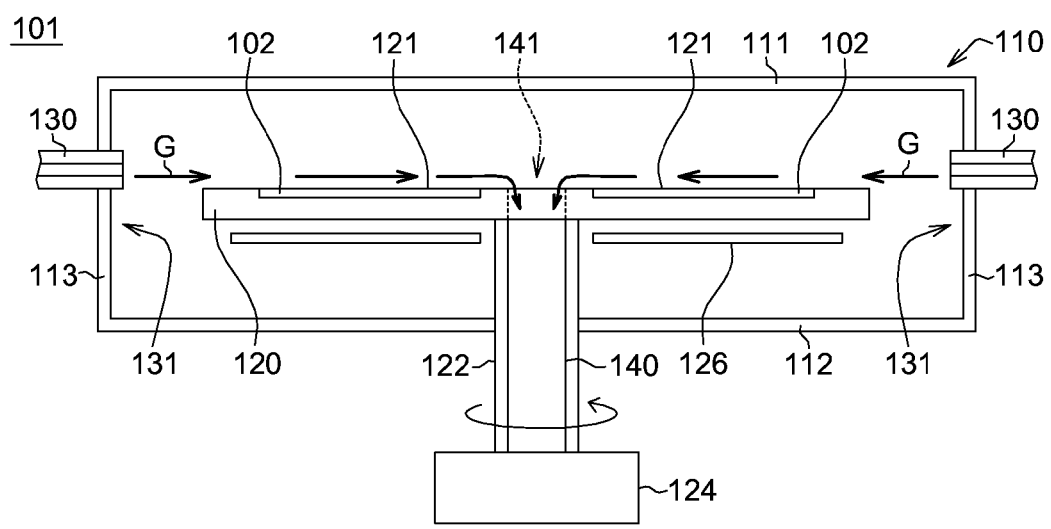
FIG. 4 is a schematic diagram of a reaction device applied in vapor deposition according to another embodiment.

Referring to FIGS. 3 and 4. FIG. 3 is a schematic diagram of a reaction device 100 applied in vapor deposition according to an embodiment. FIG. 4 is a schematic diagram of a reaction device 101 applied in vapor deposition according to another embodiment. The major difference between two embodiments illustrated in FIGS. 3 and 4 lies in the position of the discharge opening 141.

As indicated in FIG. 3, the reaction device 100 comprises a chamber 110, a susceptor 120, an inlet pipe unit 130 and an outlet pipe 140. The susceptor 120 is disposed within the chamber 110, and the substrate 102 is supported on a surface 121 of the susceptor 120. The substrate 102 is a semiconductor substrate formed by silicon, zinc oxide, silicon carbide or gallium arsenide, or a sapphire substrate. The susceptor 120 is formed by graphite susceptor or a graphite susceptor coated with silicon carbide. The substrate 102 can be heated by a heater 126 disposed underneath to reach working temperature between 800~1100° C. Also, the substrate 102 can operate at normal temperature and does not need to be heated.

Besides, the center of the susceptor 120 C has a shaft 122 which is connected to a driver 124 for driving the susceptor 120 and controlling the rotation speed of the susceptor 120 to be between 150~800 rpm. During the vapor deposition process, the susceptor 120 which supports the substrate 102 will be rotated so as to increase the uniformity of vapor deposition.

Let the chemical vapor deposition for manufacturing a semiconductor epitaxial film be taken for example. The substrate is a 2-inch or 6-inch wafer. The reaction gas G may be TMGa (trimethyl gallium) and $NH_3$ (ammonia). The carrier may be $H_2$ (hydrogen). The rotation speed of the shaft 122 is controlled to be above 300 rpm such as between 400~800 rpm. The temperature of the susceptor 120 is around 800° C. The feeding temperature of the reaction gas G is about 25° C. The operating pressure of the chamber 110 is about 500 torr. In the chamber 110, the feed rate of TMGa is 0.9 liter per minute (l/m), the feeding rate of $NH_3$ is 225 l/m, the feed rate of $H_2$ which enters the chamber 110 at the same time with TMGa is 22.5 l/m, and the feed rate of $H_2$ which enters the chamber 110 at the same time with NH3 is 63 l/m. The shaft 122 can be surrounded by a water jacket having temperature control function, and the temperature can be controlled to be between 5~95° C.

Referring to FIG. 3 and FIG. 6, the inlet pipe unit 130 comprises a plurality of feeding openings 131 horizontally facing a peripheral area of the susceptor 120 to input at least one reaction gas G into the chamber 110. In addition, a terminal end of the outlet pipe 140 has a discharge opening 141 whose position is corresponding to the center of the susceptor 120 so as to discharge unreacted gas out of the chamber 110. Let the chemical vapor deposition for manufacturing a semiconductor epitaxial film be taken for example. The reaction gas, such as TMGa (trimethyl gallium) and $NH_3$ (ammonia), is transferred by the carrier gas (such as $H_2$) to enter the chamber 110 via the feeding openings 131. The reaction gas further deposits a product of Gallium nitride (GaN) on a surface 121 of the substrate 102. The unreacted gas and the by-product flow to the discharge opening 141 disposed above the center of the susceptor 120 to be discharged out of the chamber 110. In addition, if the reaction gas is silane ($SiH_4$), then an epitaxial structure, such as polycrystalline silicon or doped polycrystalline silicon, can be deposited on the surface 121 of the substrate 102.

The reaction device 100 of the present embodiment can be applied in technology fields such as organometallic chemical vapor deposition (MOCVD), normal pressure chemical vapor deposition (APCVD), low-pressure chemical vapor deposition (LPCVD), microwave plasma-assisted chemical vapor deposition (MPCVD), and rapid thermal chemical vapor deposition (RTCVD) or technology field such as physic vapor deposition.

Referring to FIG. 4, the present embodiment is different from the embodiment of FIG. 3 in that the outlet pipe 140 of the reaction device 101 is not disposed above the center of the susceptor 120 but is disposed under the center of the susceptor 120. That is, the outlet pipe 140 can be disposed within the shaft 122 and extended to the center of the susceptor 120 via the shaft 122, such that the discharge opening 141 is located at the center of the susceptor 120 and exposed on the surface 121 of the susceptor 120. As indicated in FIGS. 3 and 4, the outlet pipe 140 can be disposed above or underneath the susceptor 120, and either disposition would do as long as the reaction gas G can be guided to move towards the center of the susceptor 120.

According to the embodiments illustrated in FIGS. 3 and 4, at least one reaction gas G is guided to move from the peripheral area S of the susceptor 120 and along the surface 121 of the susceptor 120 to reach the center of the susceptor 120, such that the product 11 is produced and deposited on the substrate 102. Then, the unreacted gas flowing to the center of the susceptor 120 is discharged out of the chamber 110 via the discharge opening 141.

In the two embodiments illustrated in FIGS. 3 and 4, the chamber 110 has an upper sidewall 111 and a lower sidewall 112, and a peripheral sidewall 113 of the chamber 110 is connected between upper sidewall 111 and the lower sidewall 112. As indicated in FIG. 3, the outlet pipe 140 is connected to the chamber 110 from the upper sidewall 111 of the reactor. As indicated in FIG. 4, the outlet pipe 140 is connected to the chamber 110 from the lower sidewall 112 of the reactor. As indicated in FIGS. 3 and 4, the inlet pipe unit 130 is connected to the chamber 110 from the peripheral sidewall 113 of the chamber 110 for providing at least one reaction gas G such as one single gas or composed of a plurality of gases. The disposition of the inlet pipe unit 130 disclosed above is for exemplification purpose only, not for limiting the scope of implementation, and any disposition would do as long as the feeding openings 131 horizontally face the peripheral area of the susceptor 120.

Figure 5A:
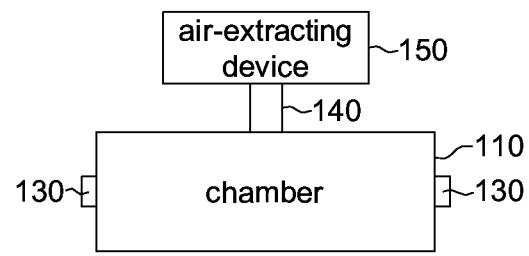
FIGS. 5A and 5B respectively are a schematic diagram of a reaction device applied in vapor deposition according to an embodiment.
Figure 5B:
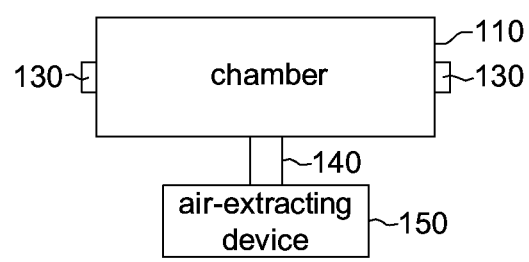

Referring to FIGS. 5A and 5B, schematic diagrams of a reaction device applied in vapor deposition according to an embodiment are respectively shown. In the present embodiment, the outlet pipe 140 is connected to an air-extracting device 150 such as a vacuum pump or an exhaust fan. The air-extracting device 150 can form a negative pressure such as 500 torr within the outlet pipe 140, such that the reaction gas within the chamber 110 is moved towards the center of the susceptor 120 (referring to FIGS. 3 and 4) and enters the discharge opening of the outlet pipe 140.

After the reaction gas G forms a solid state product, the concentration of the reaction gas G around the discharge opening 141 is lower than that around the feeding openings 131. In the present embodiment, the air-extracting device 150 makes the velocity of flow of the reaction gas G around the discharge opening 141 higher than that around the plurality of feeding openings 131 so as to increase the mass flow rate around the discharge opening 141. The increase in the mass flow rate of the reaction gas G compensates the non-uniformity in the deposition thickness caused by the decrease in the concentration of the reaction gas G.

Figure 6A:
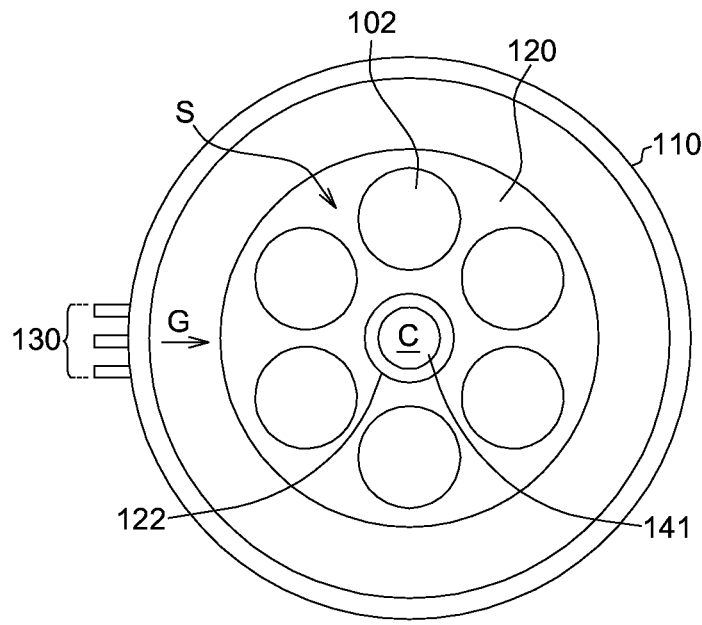
FIGS. 6A and 6B respectively are a schematic diagram of single inlet pipe unit or multi sets of inlet pipe units arranged surrounding a chamber.
Figure 6B:
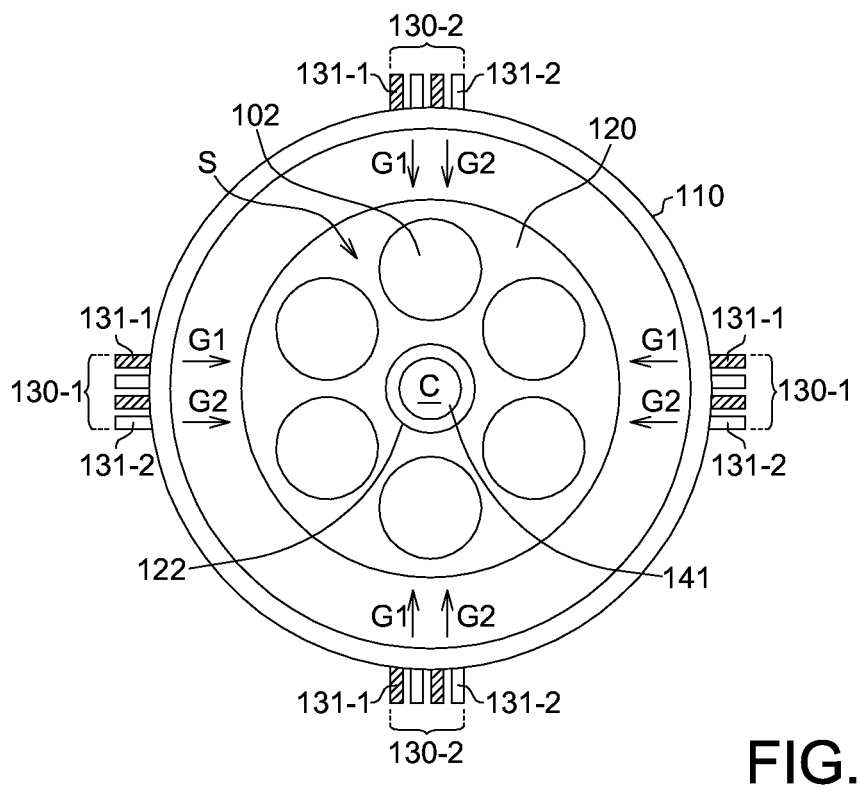

Referring to FIGS. 6A and 6B, schematic diagrams of single inlet pipe unit or multi sets of inlet pipe units arranged surrounding a chamber 110 are respectively shown. The shape of the chamber 110 is such as a cylinder or other symmetric structure. The susceptor 120 is disposed within the chamber 110, and the position of the discharge opening 141 is corresponding to the center C of the susceptor 120. A plurality of the substrates 102 are arranged in the peripheral area S of the susceptor 120, and can rotate around the center C of the susceptor 120. As indicated in FIG. 6A, the inlet pipe unit is an inlet pipe unit 130 with one-side feeding, and is located on one side of the chamber 110 to input at least one reaction gas G. As indicated in FIG. 6B, the inlet pipe units include a plurality of inlet pipe units 130-1 and 130-2 with multi-side feeding, and the plurality of inlet pipe units are disposed in pair on two opposite sidewalls surrounding the chamber 110 to input a first reaction gas G1 and a second reaction gas G2 into the chamber 110.

As indicated in FIG. 6B, each set of inlet pipe comprises at least one first reaction gas feeding opening 131-1 and at least one second reaction gas feeding opening 131-2. For example, one set of inlet pipe is feeding opening for group III or group II reaction gas and the other set of inlet pipe is feeding opening for group V or group VI reaction gas. The group III reaction gas can be one of organometallic compounds such as TMGa (trimethylgallium), TMAl (trimethylaluminum), TMIn (trimethylindium), $Cp_2Mg$ (bis(cyclopentadienyl) magnesium), and DiPTe (diisopropyltelluride). The group II reaction gas can be one of organometallic compounds such as: Cp2Mg (bis(cyclopentadienyl)magnesium), DMCd (Dimethylcadmium), DECd (Diethyl cadmium), MACd (Methyl Allyl Cadmium), (DMZ Dimethylzinc), and DEZ (Diethylzinc), The group V reaction gas can be one of the hydride gases such as $AsH_3$ (arsine), $PH_3$ (phosphine), and $NH_3$ (ammonia). The group VI reaction gas can be one of the hydride gases such as DTBS (Ditertiarybutylsulphide), DESe (Diethyl selenide), DIPSe (Di-isopropyl selenide). DMTe (Dimethyl telluride), DETe (Diethyl telluride), DIPTe (Di-isopropyl telluride), and dopant such as: Si2H6 (disilane), Titanium isopropoxide, and Titanium ethoxide.

During feeding, the organometallic compound is transferred to the reactor via a carrier gas. The hydride gas and the carrier gas are mixed together and then enter the reactor as indicated in FIG. 6B. The reaction pressure for epitaxy can be between a low pressure (10-100 torr) and a normal pressure. The susceptor temperature is between 500-1200° C. The reaction gas can form a reaction product on an epitaxial base. The reaction product may be a semiconductor of group III/V compound, such as gallium nitride (GaN), gallium arsenide (GaAs), aluminum gallium arsenide (AlGaAs), indium gallium aluminum phosphide (AlGaInP), and indium gallium nitride (InGaN) or a semiconductor of group II/VI compound, such as Zinc selenide (ZnSe), Mercury cadmium telluride (HgCdTe), Zinc Oxide (ZnO), or Zinc sulfide (ZnS).

Figure 7A:
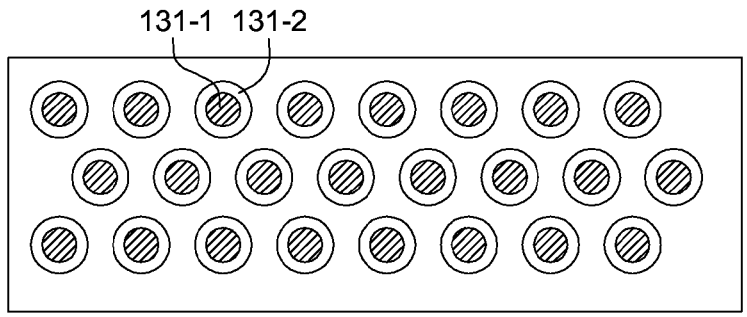
FIGS. 7A~7D are different arrangements of feeding openings.
Figure 7B:
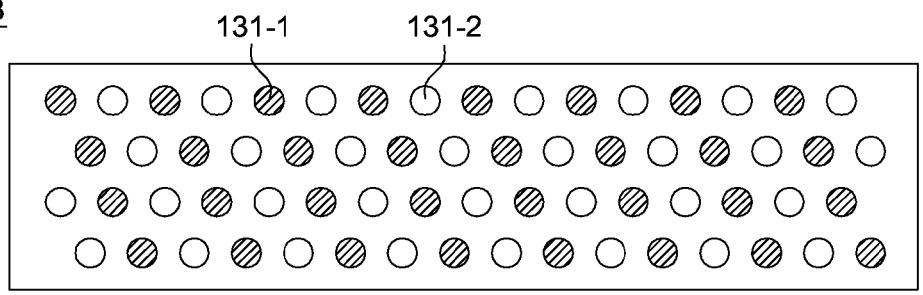
Figure 7C:
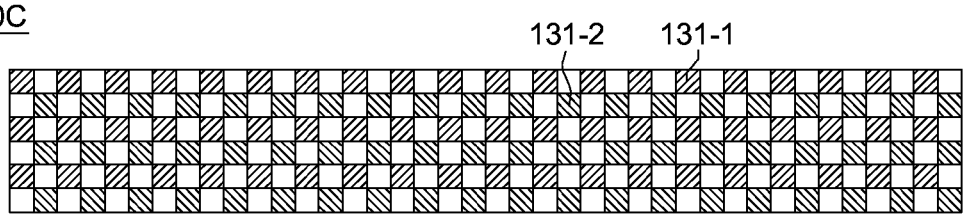
Figure 7D:
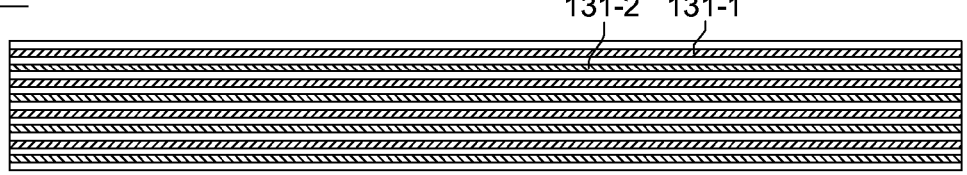

Referring to FIGS. 7A~7D, different arrangements of feeding openings are shown. As indicated in FIG. 7A, an inlet pipe unit 130A is arranged as arrays of concentric circles composed of a plurality of first reaction gas feeding openings 131-1 and a plurality of second reaction gas feeding openings 131-2. As indicated in FIG. 7B, an inlet pipe unit 130B is arranged as arrays of round holes composed of a plurality of first reaction gas feeding openings 131-1 and a plurality of second reaction gas feeding openings 131-2 interlaced with each other. As indicated in FIG. 7C, an inlet pipe unit 130C is arranged as latticed arrays of squared holes composed of a plurality of first reaction gas feeding openings 131-1 and a plurality of second reaction gas feeding openings 131-2 interlaced with each other. As indicated in FIG. 7D, an inlet pipe unit 130D is arranged as arrays of strip-shaped slits composed of a plurality of first reaction gas feeding openings 131-1 and a plurality of second reaction gas feeding openings 131-2 interlaced with each other.

Thus, no matter the feeding openings are interlaced or arranged as arrays of concentric circles, the reaction gas provided via each feeding opening can be fully mixed in the chamber 110 so as to increase the response efficiency of vapor deposition.

Besides, the height position of the feeding openings 131 affects the uniformity of vapor deposition and the deposition rate. The height position of the feeding openings 131 can be higher than or equal to that of the susceptor 120. As indicated in FIGS. 3 and 4, when the lowest position of the plurality of feeding openings 131 is not lower than the highest position of the susceptor 120 (referring to the surface 121 of the susceptor as indicated in FIGS. 3 and 4), the thickness of coating film will not be non-uniform. How to obtain appropriate height position of the feeding openings 131 with respect to the height position of the feeding openings 131 is disclosed in fluid simulation analysis below.

Figure 8A:
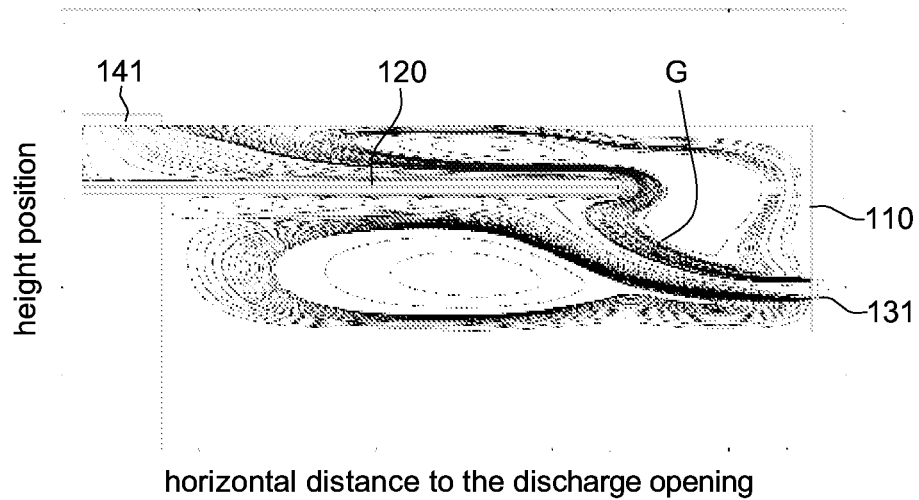
FIGS. 8A~8C are schematic diagrams of fluid simulation analysis.
Figure 8B:
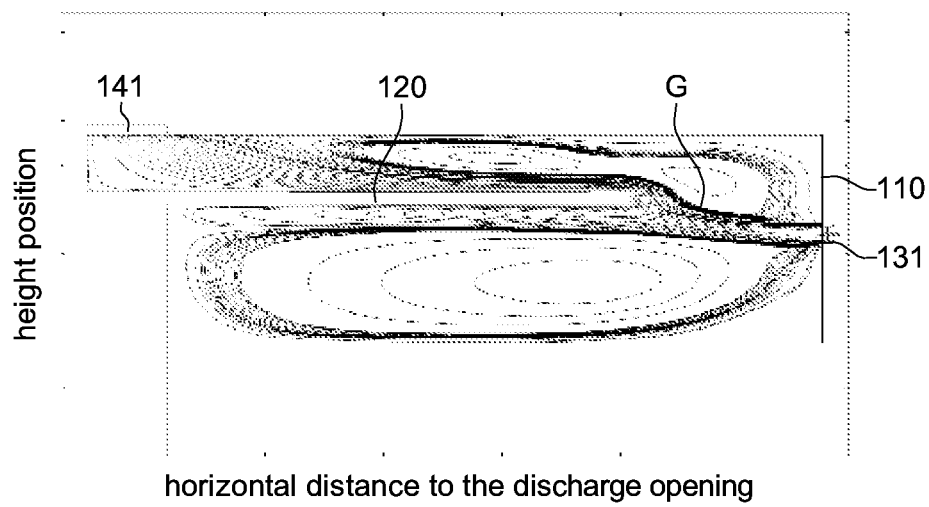
Figure 8C:
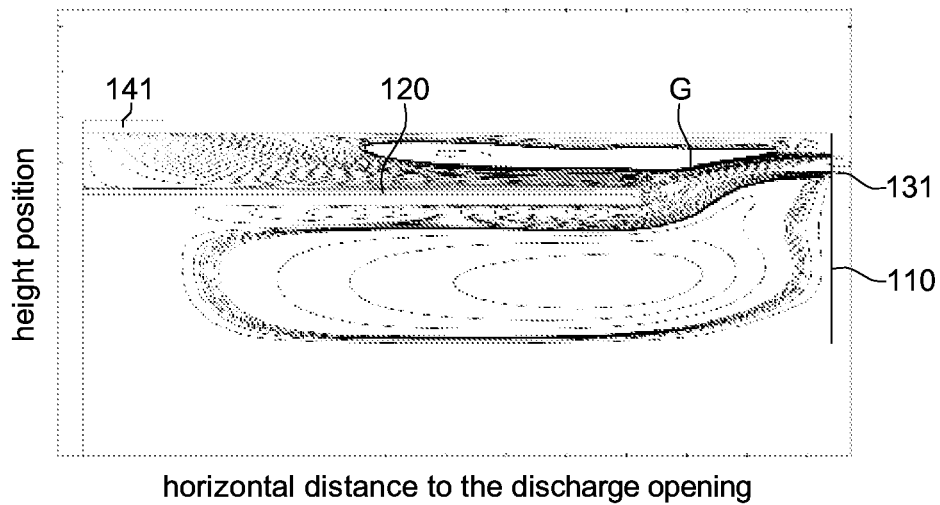

Referring to FIGS. 8A~8C, schematic diagrams of fluid simulation analysis are shown. As indicated in FIG. 8A, when the height position of the feeding openings 131 is far lower than that of the lowest position of the susceptor 120, a part of the reaction gas G concentrates under the susceptor 120 and another part of the reaction gas G is moved to the top of the susceptor 120 from the peripheral area of the susceptor 120, and then is discharged from the chamber via the discharge opening 141. As indicated in FIG. 8B, when the height position of the feeding openings 131 is slightly lower than that of the lowest position of the susceptor 120, a part of the reaction gas G concentrates under the susceptor 120, and another part of the reaction gas G is moved to the top of the susceptor 120 from the peripheral area of the susceptor 120, and then is discharged from the chamber via the discharge opening 141. As indicated in FIG. 8C, when the lowest position of the feeding openings 131 is higher than the highest position of the susceptor 120, a small amount of the reaction gas G is moved downwards to the underneath of the susceptor 120 from the peripheral area of the susceptor 120, and most of the reaction gas G concentrates at the top of the susceptor 120, and then is discharged from the chamber via the discharge opening 141.

Figure 9:
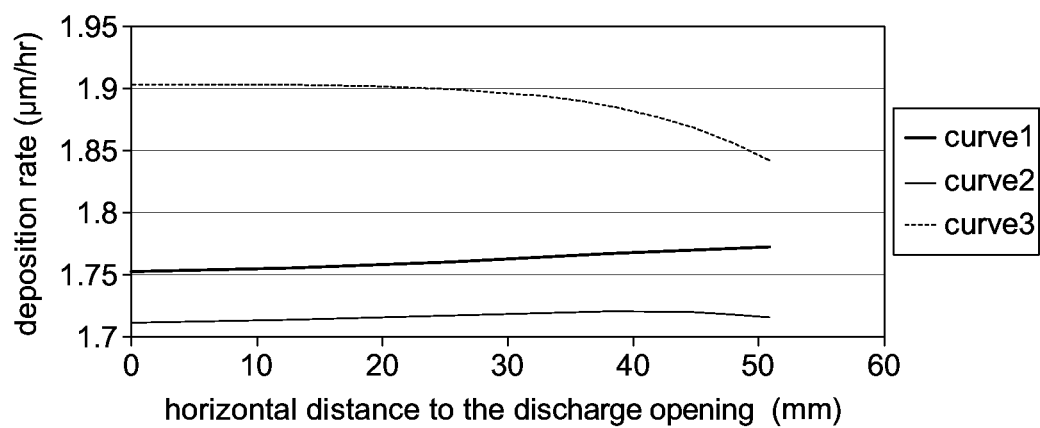
FIG. 9 is a comparison diagram of results of computational fluid simulation analysis.

A comparison of the results of fluid simulation analysis based on three scenarios disclosed above is illustrated in FIG. 9. The vertical axis represents the deposition rate of reaction gas; the horizontal axis represents the horizontal distance to the discharge opening. Referring to FIG. 9. Curve 1 is based on the simulation result of FIG. 8A, wherein the average deposition rate is 1.76 μm/hr, and the difference in the thickness of coating is 1.14%. Curve 2 is based on the simulation result of FIG. 8B, wherein the average deposition rate is 1.72 μm/hr, and the difference in the thickness of coating is 0.54%. Curve 3 is based on the simulation result of FIG. 8C, wherein the average deposition rate 1.87 is μm/hr, and the difference in the thickness of coating is 3.38%.

It can be known from the above disclosure that the height position of the feeding openings 131 affects the uniformity of vapor deposition and the deposition rate. In order to increase the uniformity of vapor deposition, appropriate height position of the feeding openings 131 can be selected. For example, when the lowest height of the feeding openings 131 approaches the height of the susceptor 120, the fluid simulation result shows that the difference in the thickness of coating film can be minimized.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A reaction device for chemical vapor deposition, comprising:
   a chamber;
   a susceptor disposed within the chamber;
   an inlet pipe unit comprising at least one feeding opening horizontally facing a peripheral area of the susceptor to input at least one reaction gas into the chamber, wherein the at least one reaction gas is guided to move from the peripheral area of the susceptor and along a surface of the susceptor to reach a center of the susceptor; and
   an outlet pipe comprising a discharge opening whose position corresponds to the center of the susceptor and vertical to said surface of the susceptor so as to discharge the reaction gas flowing to the center of the susceptor out of the chamber.

2. The reaction device for chemical vapor deposition according to claim 1, wherein the chamber has an upper sidewall and a lower sidewall, a peripheral sidewall of the chamber is connected between the upper sidewall and the lower sidewall, and the inlet pipe unit is connected into the chamber from the peripheral sidewall of the chamber.

3. The reaction device for chemical vapor deposition according to claim 2, wherein the outlet pipe is connected into the chamber from the upper sidewall or the lower sidewall of the reactor.

4. The reaction device for chemical vapor deposition according to claim 1, wherein the susceptor is rotatable, and the center of the susceptor has a shaft for driving the susceptor.

5. The reaction device for chemical vapor deposition according to claim 4, wherein the outlet pipe is disposed within the shaft and extends to the center of the susceptor via the shaft.

6. The reaction device for chemical vapor deposition according to claim 5, wherein the discharge opening is located at the center of the susceptor and exposed at the center of the susceptor.

7. The reaction device for chemical vapor deposition according to claim 1, wherein the feeding opening comprises a plurality of first reaction gas feeding openings and a plurality of second reaction gas feeding openings, the plurality of first and second reaction gas feeding openings are interlaced with each other or arranged in a form of concentric circles, and the interlaced arrangement is formed by a plurality of independent round holes, a plurality of squared holes arranged in a lattice, or a plurality of strip-shaped slits.

8. The reaction device for chemical vapor deposition according to claim 1, wherein the inlet pipe unit includes an inlet pipe unit with one-side feeding or a plurality of inlet pipe units with multi-side feeding, and the plurality of inlet pipe units are disposed in pairs on two opposite sidewalls surrounding the chamber.

9. The reaction device for chemical vapor deposition according to claim 1, wherein a lowest height of the plurality of feeding openings is not lower than a highest height of the susceptor.

10. The reaction device for chemical vapor deposition according to claim 1, further comprising an air-extracting device connected to the outlet pipe, wherein the air-extracting device forms a negative pressure within the outlet pipe for guiding the at least one reaction gas within the chamber to reach the center of the susceptor, a concentration of the at least one reaction gas around the discharge opening is smaller than that around the plurality of feeding openings, and a velocity of flow of the at least one reaction gas around the discharge opening is higher than that around the plurality of feeding openings.

11. The reaction device for chemical vapor deposition according to claim 1, wherein the inlet pipe unit comprises two sets of feeding openings, one set for a first reaction gas, and the other set for a second reaction gas.

12. The reaction device for chemical vapor deposition according to claim 11, wherein a heating device is disposed underneath the susceptor for heating the susceptor.

13. A reaction device for chemical vapor deposition, comprising:
   a chamber;
   a susceptor disposed within the chamber;
   an inlet pipe unit comprising at least two feeding openings horizontally facing at least two opposite peripheral areas of the susceptor to input at least one reaction gas into the chamber, wherein the at least one reaction gas is guided to move from the at least two peripheral areas of the susceptor and along a surface of the susceptor to reach a center of the susceptor; and an outlet pipe comprising a discharge opening whose position corresponds to the center of the susceptor and vertical to said surface of the susceptor so as to discharge the reaction gas flowing to the center of the susceptor out of the chamber.

* * * * *